(12) United States Patent
Suzuki et al.

(10) Patent No.: US 7,944,957 B2
(45) Date of Patent: May 17, 2011

(54) SURFACE EMITTING SEMICONDUCTOR LASER, METHOD FOR FABRICATING SURFACE EMITTING SEMICONDUCTOR LASER, MODULE, LIGHT SOURCE APPARATUS, DATA PROCESSING APPARATUS, LIGHT SENDING APPARATUS, OPTICAL SPATIAL TRANSMISSION APPARATUS, AND OPTICAL SPATIAL TRANSMISSION SYSTEM

(75) Inventors: Teiichi Suzuki, Kanagawa (JP); Daisuke Nagao, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 11/946,327

(22) Filed: Nov. 28, 2007

(65) Prior Publication Data
US 2008/0279229 A1 Nov. 13, 2008

(30) Foreign Application Priority Data
May 11, 2007 (JP) .................................. 2007-126571

(51) Int. Cl.
*H01S 5/00* (2006.01)
(52) U.S. Cl. ...... 372/45.01; 372/18; 372/19; 372/43.01; 372/46.01; 372/46.013; 372/50.124; 372/98; 257/E33.011
(58) Field of Classification Search .................... 372/19, 372/18, 43.01, 46.01, 46.013, 50.124, 98, 372/45.01; 257/E33.011
See application file for complete search history.

(56) References Cited

U.S. PATENT DOCUMENTS

| | | | | |
|---|---|---|---|---|
| 6,185,241 B1 * | 2/2001 | Sun | ............................... | 372/96 |
| 6,507,595 B1 * | 1/2003 | Kapon et al. | ............. | 372/45.013 |
| 6,751,245 B1 * | 6/2004 | Wasserbauer et al. | ..... | 372/46.01 |
| 6,874,954 B2 * | 4/2005 | Takagi et al. | .................... | 385/92 |
| 6,931,042 B2 * | 8/2005 | Choquette et al. | .......... | 372/43.01 |
| 7,339,969 B2 * | 3/2008 | Chirovsky | ............... | 372/50.124 |
| 7,443,899 B2 * | 10/2008 | Ueki | .......................... | 372/46.01 |
| 2002/0006143 A1 * | 1/2002 | Nakayama et al. | ............. | 372/45 |
| 2002/0141472 A1 * | 10/2002 | Koyama et al. | ................. | 372/96 |
| 2004/0114652 A1 * | 6/2004 | Yoshikawa | ...................... | 372/46 |
| 2004/0151221 A1 | 8/2004 | Yamamoto et al. | | |
| 2004/0252736 A1 * | 12/2004 | Nakayama et al. | ............. | 372/36 |
| 2005/0100063 A1 * | 5/2005 | Wasserbauer et al. | .......... | 372/19 |
| 2005/0265412 A1 * | 12/2005 | Ueki | .......................... | 372/43.01 |
| 2006/0007979 A1 * | 1/2006 | Jikutani et al. | .................. | 372/92 |
| 2006/0093006 A1 * | 5/2006 | Jikutani | ...................... | 372/50.1 |
| 2006/0120426 A1 * | 6/2006 | Kuwata | .................... | 372/50.124 |

FOREIGN PATENT DOCUMENTS

| | | |
|---|---|---|
| CN | 1508915 | 6/2004 |
| JP | 8-56049 | 2/1996 |
| JP | 11-204875 | 7/1999 |
| JP | 2002-359432 | 12/2002 |

* cited by examiner

*Primary Examiner* — Minsun Harvey
*Assistant Examiner* — Yuanda Zhang
(74) *Attorney, Agent, or Firm* — Fildes & Outland, P.C.

(57) ABSTRACT

A surface emitting semiconductor laser includes a substrate, a lower reflective mirror formed on the substrate, an active layer formed on the lower reflective mirror, an upper reflective mirror formed on the active layer, an optical mode controlling layer formed between the lower reflective mirror and the upper reflective mirror, and a current confining layer formed between the lower reflective mirror and the upper reflective mirror. The active layer emits light. The upper reflective mirror forms a resonator between the lower reflective mirror and the upper reflective mirror. In the optical mode controlling layer, an opening is formed for selectively absorbing or reflecting off light that is emitted in the active layer. The optical mode controlling layer optically controls mode of laser light. The current confining layer confines current that is applied during driving.

12 Claims, 9 Drawing Sheets

US 7,944,957 B2

SURFACE EMITTING SEMICONDUCTOR LASER, METHOD FOR FABRICATING SURFACE EMITTING SEMICONDUCTOR LASER, MODULE, LIGHT SOURCE APPARATUS, DATA PROCESSING APPARATUS, LIGHT SENDING APPARATUS, OPTICAL SPATIAL TRANSMISSION APPARATUS, AND OPTICAL SPATIAL TRANSMISSION SYSTEM

CROSS-REFERENCE TO RELATED APPLICATIONS

This application is based on and claims priority under 35 USC 119 from Japanese Patent Application No. 2007-126571 filed May 11, 2007.

BACKGROUND

1. Technical Field

This invention relates to a surface emitting semiconductor laser, a method for fabricating a surface emitting semiconductor laser, a module, a light source apparatus, a data processing apparatus, a light sending apparatus, an optical spatial transmission apparatus, and an optical spatial transmission system.

2. Related Art

In technical fields such as optical communication or optical storage, there has been a growing interest in surface emitting semiconductor lasers, i.e., Vertical-Cavity Surface-Emitting Lasers (hereinafter referred to as VCSELs). VCSELs have excellent characteristics which edge-emitting semiconductor lasers do not have. For example, VCSELs feature lower threshold current and smaller power consumption. With VCSELs, a round light spot can be easily obtained, and evaluation can be performed while they are on a wafer, and light sources can be arranged in two dimensional arrays. With these characteristics, demands for VCSELs as light sources in the communication field have especially been expected to grow.

In a case where a VCSEL is used as a light source or the like for optical transmission, selection of mode of laser light is required. For example, in a case where a VCSEL is coupled to an optical fiber and a long-distance communication is to be performed, single-mode is more preferable. To obtain single-mode, in general, it is required to make the diameter of a current confining layer of the VCSEL to about 3 to 4 micrometers.

For a VCSEL of a selective oxidation type, AlAs or AlGaAs having a high Al-composition is used for the current confining layer, and a portion of the current confining layer is oxidized to form an aperture in the current confining layer, and a portion of the current confining layer is oxidized to form an aperture in the current confining layer. Because the aperture is formed by an oxidizing reaction of Al, it is difficult to accurately control the diameter, and especially, it is difficult to reproduce a small aperture diameter for obtaining single-mode, resulting in a reduction in yield of the VCSEL.

The present invention aims to provide a surface emitting semiconductor laser in which mode control can be performed more effectively than the mode control by surface processing of a light emitting surface of a related art, and a module, a light source apparatus, a data processing apparatus, a light sending apparatus, an optical spatial transmission apparatus, and an optical spatial transmission system, which use the surface emitting semiconductor laser, and a method for fabricating a surface emitting semiconductor laser.

SUMMARY

An aspect of the present invention provides a surface emitting semiconductor laser including a substrate; a lower reflective mirror formed on the substrate; an active layer formed on the lower reflective mirror, and emitting light; an upper reflective mirror formed on the active layer, and forming a resonator between the lower reflective mirror and the upper reflective mirror; an optical mode controlling layer formed between the lower reflective mirror and the upper reflective mirror, and optically controlling mode of laser light; and a current confining layer formed between the lower reflective mirror and the upper reflective mirror, and confining current that is applied during driving. In the optical mode controlling layer, an opening is formed for selectively absorbing or reflecting off light that is emitted in the active layer.

BRIEF DESCRIPTION OF THE DRAWINGS

Exemplary embodiments of the present invention will be described in detail based on the following figures, wherein:

FIGS. 1A and 1B are cross sectional views illustrating a configuration of a VCSEL according to a first example of the present invention, wherein FIG. 1A illustrates a status before an upper DBR is formed, and FIG. 1B illustrates a status after the upper DBR is formed;

DETAILED DESCRIPTION

Referring to the accompanying drawings, exemplary embodiments for implementing the present invention will be now described.

Figure 1A:
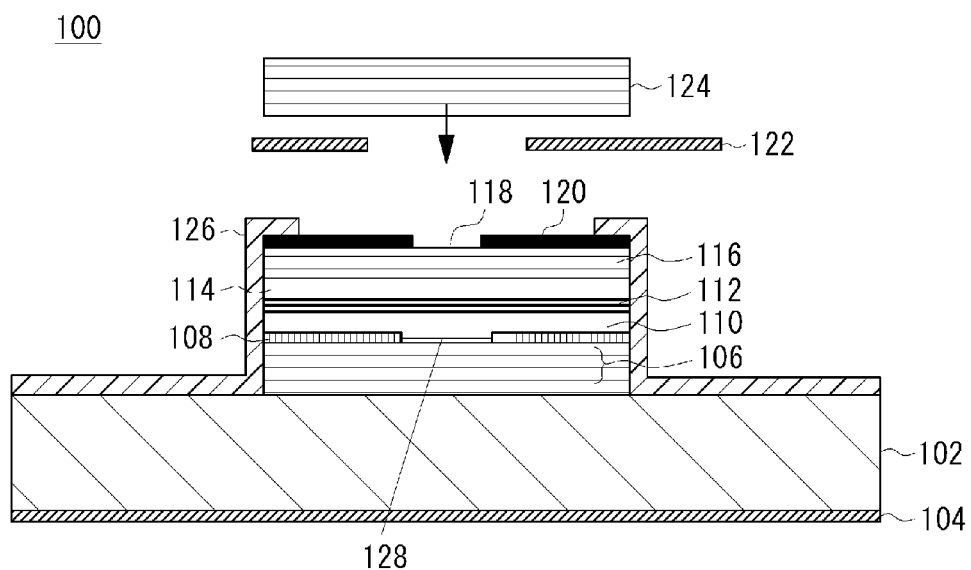
Figure 1B:
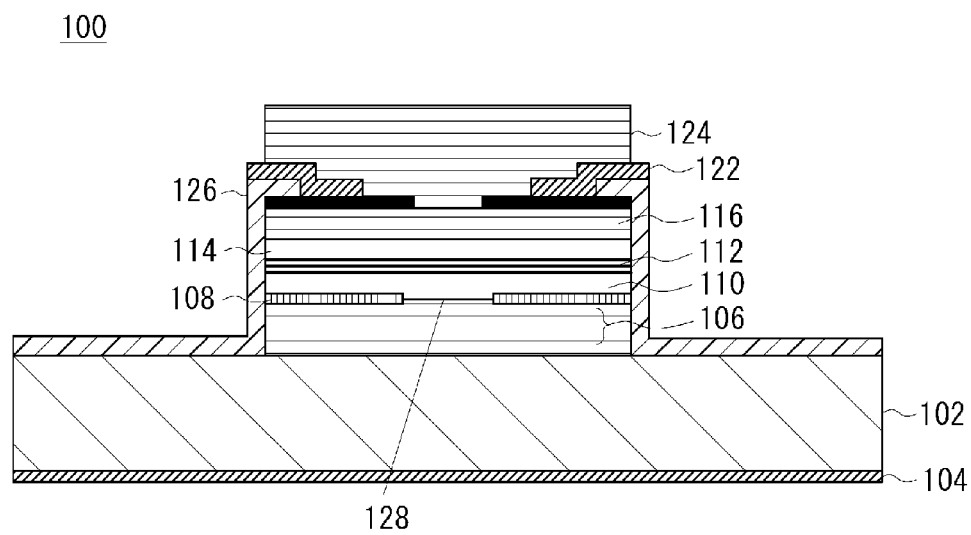

FIG. 1A and FIG. 1B are schematic cross sectional views illustrating a configuration of a VCSEL according to an example of the present invention. A VCSEL 100 according to an example includes a p-side electrode 104 on a back surface of a p-type GaAs substrate 102. Stacked on the substrate 102 are: a lower DBR (Distributed Bragg Reflector) 106 that composes a reflective mirror of multilayer films in which two types of p-type $Al_xGa_{1-x}As$ having different x values are overlaid one another; a current confining layer 108 made of p-type $Al_{0.98}Ga_{0.02}As$; a p-type lower spacer layer 110; an active layer 112 having a quantum well structure; an n-type upper spacer layer 114; an intermediate DBR 116 that composes a partial reflective mirror of multilayer films in which a few periods of two types of n-type $Al_xGa_{1-x}As$ having different x values are overlaid; an optical mode controlling layer 120 made of n-type GaAs, in which an opening 118 is formed at a center portion thereof; an n-side electrode 122 ohmic-contacted to the optical mode controlling layer 120; an upper DBR 124 that composes a reflective mirror of dielectric multilayer films in which $SiO_2$ and $TiO_2$ are alternately stacked; and an insulating layer 126 of SiN or the like that covers a bottom portion, a side surface, and a portion of a top portion of a post structure P formed on the substrate 102.

The semiconductor layers on the substrate from the lower DBR 106 to the optical mode controlling layer 120 are formed by a series of epitaxial growth. Then, by etching the semiconductor layers from the optical mode controlling layer 120 to the lower DBR 106, a cylindrical post structure P is formed. The optical mode controlling layer 120 being the uppermost layer of the post structure P is a GaAs layer. By not exposing Al on the surface, oxidation is prevented.

After the post structure P is formed, the current confining layer 108 is oxidized from the side surface of the post structure P. The current confining layer 108 has a higher Al-composition than other semiconductor layers do, and thus has a higher oxidation speed than other semiconductor layers. By this oxidation, a highly reflective portion is formed at periphery of the current confining layer 108, and a conductive portion 128 surrounded by the highly reflective portion is formed. The conductive portion 128 confines current during operation, and the diameter thereof may be about 8 to 6 micrometers. The current confining layer may be made of AlAs.

The optical mode controlling layer 120 performs light absorption or light reflection of oscillation wavelength near the active layer 112 that is sandwiched between the lower DBR 106 and the upper DBR 124. Alternatively, the optical mode controlling layer 120 may change refractive index near the active layer 112 that is sandwiched between the lower DBR 106 and the upper DBR 124. The optical mode controlling layer 120 controls lasing mode, especially controls transverse mode, by optically absorbing or reflecting off light.

In the VCSEL of this example, the oscillation at around 850 nm is contemplated, and the thickness of the optical mode controlling layer 120 is about 200 nm. The opening 118 is formed by etching the GaAs layer at a center portion of the optical mode controlling layer 120. In the opening 118, absorption of light of 850 nm does not occur; however, at a portion where GaAs is remained, light absorption occurs, and thus gain is reduced during laser oscillation.

The opening 118 of the optical mode controlling layer 120 is formed by a photolithography process. By this process, the opening 118 may become an accurate pattern depending on the accuracy of the photolithography. Each of the centers of the opening 118 and the conductive portion 128 coincides with an optical axis. Preferably, the diameter of the opening 118 is 4 to 3 micrometers, and smaller than the diameter of the conductive portion 128. By accurately forming the diameter of the opening 118, the control of lasing mode can be more accurately performed.

The optical mode controlling layer 120 is disposed in proximity to the active layer 112 through the intermediate DBR 116. The intermediate DBR 116 is interposed to perform gettering of gold or the like diffused from the n-side electrode 122 that is ohmic-contacted to the optical mode controlling layer 120. However, the optical mode controlling layer 120 may be formed on the active layer 112 or the upper spacer layer 114. The optical mode controlling layer 120 is formed in a gain medium, not on the top surface being the light emitting surface of laser light, and thus lasing mode can be extremely effectively controlled. In other words, a slight change in shape of the opening 118 can significantly affect lasing mode.

FIGS. 2A to 2D are plan views of examples of a profile of an optical mode controlling layer. The optical mode controlling layer shown in FIGS. 2A to 2C controls mainly transverse mode, and the optical mode controlling layer shown in FIG. 2D controls mainly polarization.

Figure 2A:
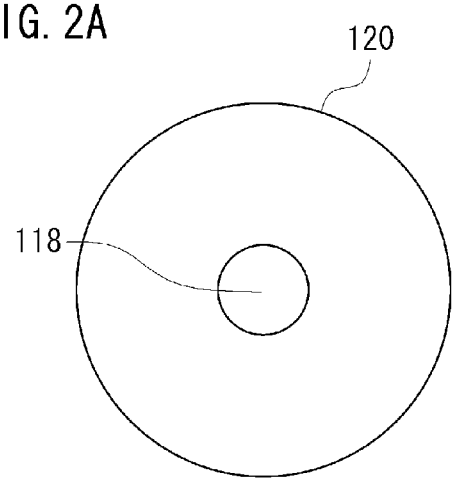
FIGS. 2A to 2D are plan views illustrating a profile of an optical mode controlling layer.
Figure 3A:
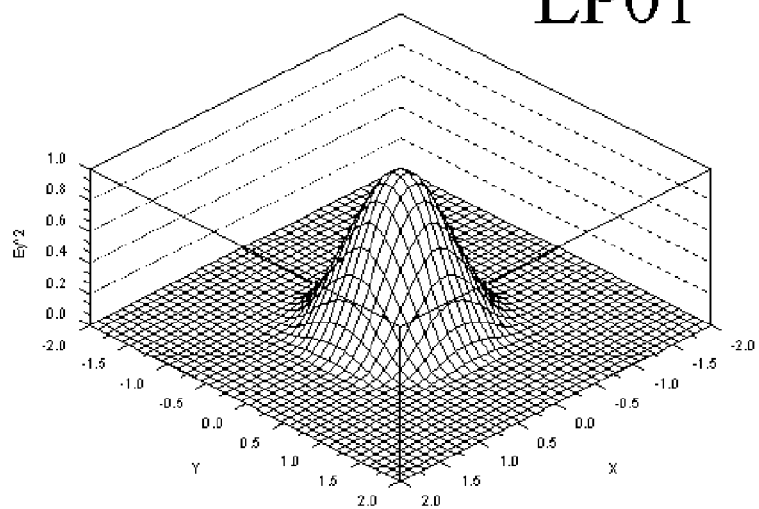
FIGS. 3A and 3B illustrate light intensity distributions in which transverse mode control is performed by an optical mode controlling layer.

In FIG. 2A, the optical mode controlling layer 120 is formed in a round shape when the post structure P is formed, and the round-shaped opening 118 being nearly concentric with outer profile of the round shape is formed. The center of the opening 118 coincides with the center of the conductive portion 128 of the current confining layer 108 as described above, and coincides with the optical axis. By making the diameter of the opening 118 nearly equal to or smaller than the diameter of the conductive portion 128, transverse mode can be controlled, and single-mode laser light can be obtained. The light intensity distribution in which transverse mode control by the example of FIG. 2A is performed is shown in FIG. 3A. As shown in FIG. 3A, the light intensity distribution of laser light becomes a single-peaked single-mode.

Figure 2B:
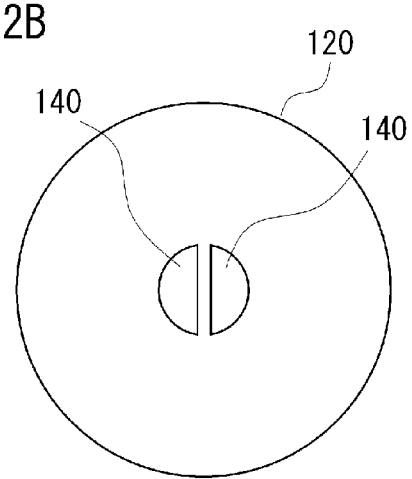
Figure 3B:
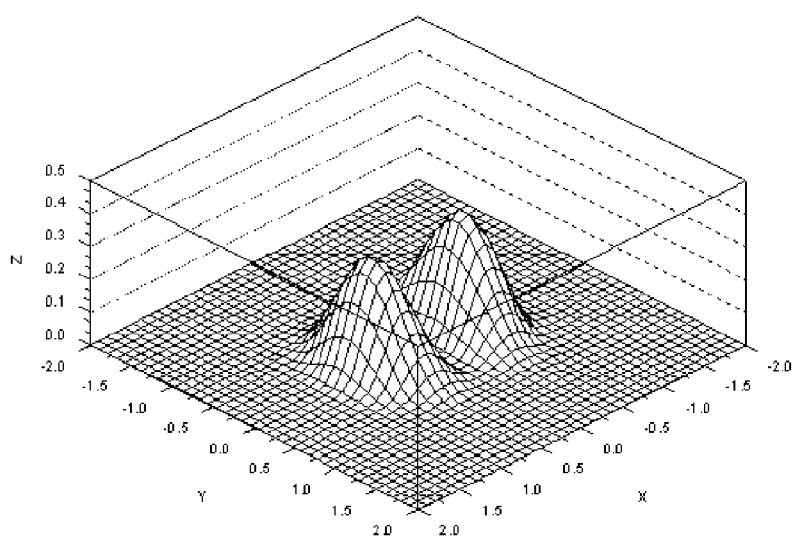

The optical mode controlling layer 120 shown in FIG. 2B has two semicircular openings 140 that are line-symmetric and divided along a center line of the round-shaped opening. By this configuration, gain at a portion where GaAs is remained becomes smaller. As shown in FIG. 3B, the light intensity distribution of laser light becomes a double-peaked single-mode having peaks that correspond to the two semicircular openings 140.

Figure 2C:
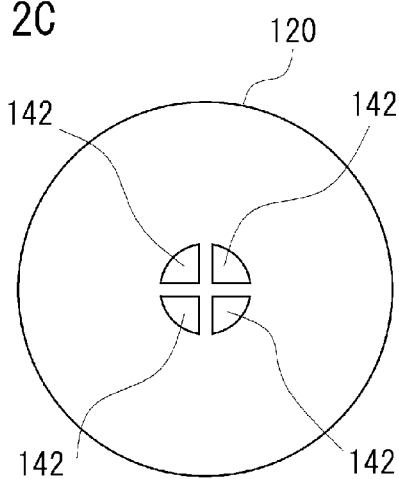

The optical mode controlling layer 120 shown in FIG. 2C has four fan-shaped openings 142 that are point-symmetric in which a round-shaped opening is divided into four. By this configuration, the light intensity distribution of laser light becomes a single-mode having four peaks that correspond to the openings 142.

Figure 2D:
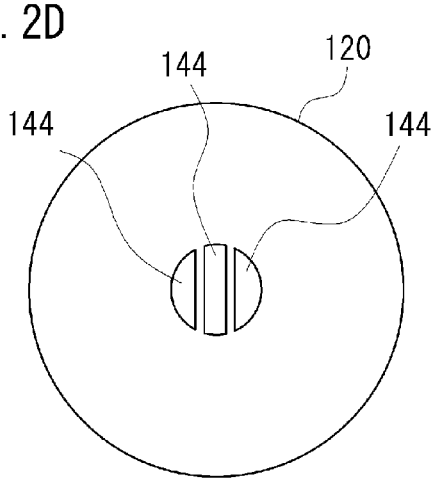

The optical mode controlling layer 120 shown in FIG. 2D is formed by dividing a round-shaped opening in a direction of a straight line to form three slits 144. By this configuration, the light intensity distribution of laser light becomes a pattern having three peaks that correspond to the three slits. In addition, emitted laser light is aligned in a direction of the slits 144, which is effective in controlling polarization.

Other than the control of transverse mode or polarization of laser light as described above, the optical mode controlling layer 120 is capable of controlling vertical mode of laser light. In other words, by changing the diameter of the opening 118 of the optical mode controlling layer 120, oscillation wavelength can be selected.

Figure 4:
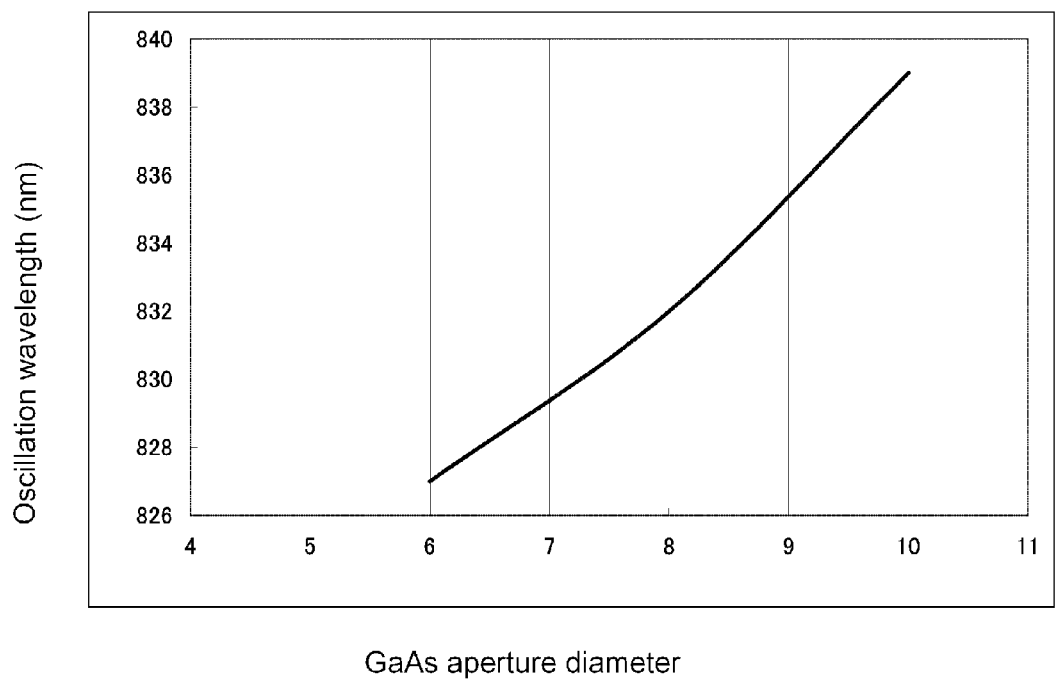
FIG. 4 is a graph illustrating the relation between the diameter of the opening of the optical mode controlling layer and the oscillation wavelength.

FIG. 4 illustrates the relation between the diameter of the opening 118 of the optical mode controlling layer 120 and the oscillation wavelength, when the diameter of the conductive portion 128 of the current confining layer 108 is kept constant. As obvious from FIG. 4, when the diameter of the opening 118 (GaAs aperture diameter shown in the horizontal axis) is increased from 6 micrometers to 10 micrometers, in approximate proportion to the increase, the oscillation wavelength increases from about 827 nm to 839 nm. Therefore, laser light having a desired oscillation wavelength can be obtained by selecting the diameter of the opening 118.

A second example of the present invention will be now described. In the first example, the opening 118 is formed by etching the GaAs layer that is the optical mode controlling layer. However, etching selectivity between the GaAs layer and an AlGaAs layer underlying thereof is small, and thus the underlying AlGaAs layer is over etched. This alters the thickness of the intermediate DBR 116, which is undesirable. Therefore, in the second example, a configuration that can avoid such damage in thickness due to etching is adopted.

Figure 5:
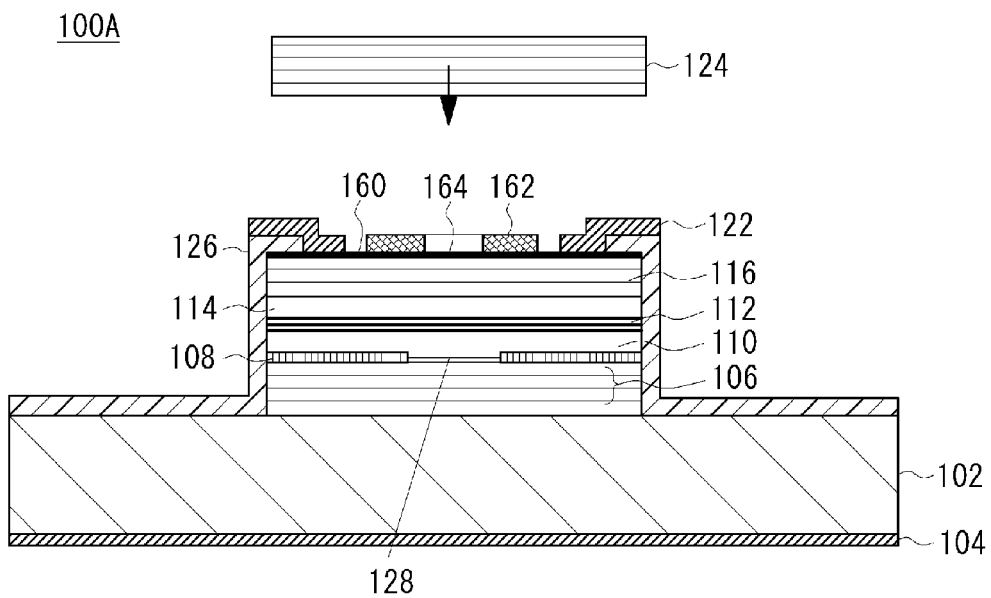
FIG. 5 is a schematic cross sectional view illustrating a configuration of a VCSEL according to a second example of the present invention.

FIG. 5 illustrates a schematic cross sectional view of a VCSEL according to a second example, wherein same reference numerals are used for a same configuration as that of the first example. In a VCSEL 100A of the second example, as a cap layer of the post structure P, that is, the final layer by epitaxial growth, an n-type GaAs layer 160 have a thickness of 20 nm is formed. On the periphery of the GaAs layer 160, the n-side electrode 122 is ohmic-contacted, and a ring shaped optical mode controlling layer 162 is formed spaced apart from the n-side electrode 122. In a center portion of the optical mode controlling layer 162, a round-shaped opening 164 is formed. The center of the opening 164 coincides with the optical axis, and the diameter of the opening 164 is equal to or slightly smaller than the diameter of the conductive portion 128. The optical mode controlling layer 162 may be made of a metal, such as gold, titanium, tungsten, or the like, and is formed with high accuracy by lift-off. In a lift-off process, a resist is etched when a resist pattern is formed. The selectively between the resist and the GaAs layer 160 is sufficient, and the damage in thickness of the intermediate DBR 116 can be prevented.

The GaAs layer 160 being the cap layer has an extremely thin thickness, and thus it passes light emitted in the active layer 112. The light that is passed through the GaAs layer 160 is reflected off in a portion where the metal of the optical mode controlling layer 162 exists on interface thereof, and is passed through the opening 164 in which no metal exists. By this configuration, similarly to the case of the first example, control of transverse mode, control of polarization, and control of vertical mode of laser light being oscillated can be performed.

Figure 6:
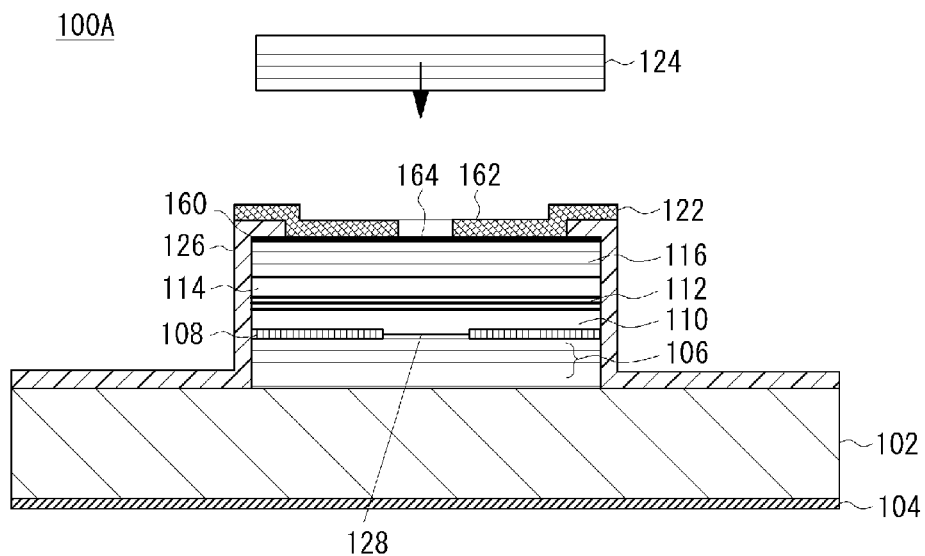
FIG. 6 is a schematic cross sectional view illustrating a modified example of a VCSEL according to a second example of the present invention.

In the example shown in FIG. 5, the optical mode controlling layer 162 is formed spaced apart from the n-side electrode 122; however, for example, in a case where gold (Au) that can be ohmic-contacted to the GaAs layer 160 is used for the n-side electrode 122, the n-side electrode 122 and the optical mode controlling layer 162 can be formed simultaneously by lift-off, such that they are connected each other as shown in FIG. 6.

In addition, in the second example, the optical mode controlling layer that reflects off light having an oscillation wavelength; however, an optical mode controlling layer that absorbs light having an oscillation wavelength may be formed. For example, if the oscillation wavelength is around 1 micrometer, the optical mode controlling layer shown in FIG. 5 may be formed of amorphous silicon. The amorphous silicon absorbs a wavelength of 1 micrometer. Therefore, similarly to a case where light is reflected off, control of transverse mode of oscillation wavelength, control of polarization, and control of vertical mode can be performed.

Figure 7:
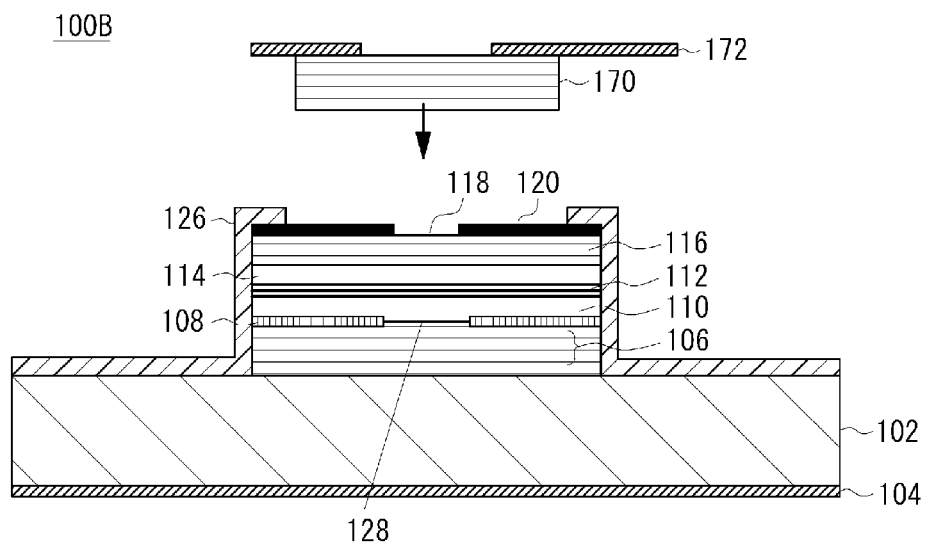
FIG. 7 is a schematic cross sectional view illustrating a configuration of a VCSEL according to a third example of the present invention.

A third example of the present invention will be now described. In the first example, the n-side electrode 122 is formed between the optical mode controlling layer 120 and the upper DBR; however, in a VCSEL 100B according to a third example, as shown in FIG. 7, after forming the optical mode controlling layer 120, an n-type upper DBR 170 is formed thereon, and an n-side electrode 172 is formed thereon. The upper DBR 170 may be formed of semiconductor multilayer films such as ITC, and the n-side electrode 172 is electrically coupled to the optical mode controlling layer 120 through the upper DBR 170. Other configuration is same as that of the first example.

Figure 8A:
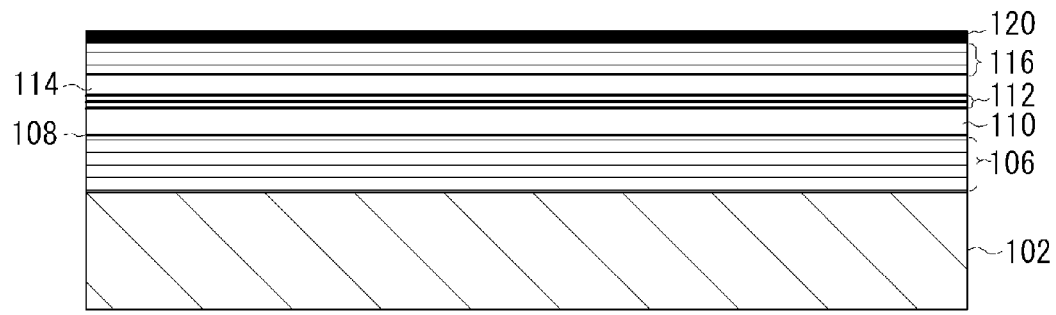
FIGS. 8A to 8C are cross sectional views illustrating a process of a method for fabricating a VCSEL according to a first example of the present invention.

Referring now to FIGS. 8A to 8C and FIGS. 9A to 9C, a method for fabricating a VCSEL according to a first example will be described. As shown in FIG. 8A, by Metal Organic Chemical Vapor Deposition (MOCVD), sequentially stacked on the p-type GaAs substrate 102 are: the p-type lower DBR 106 having a carrier concentration of $1 \times 10^{18}$ cm$^{-3}$ in which 40.3 periods of, for example, $Al_{0.9}Ga_{0.1}As$ and $Al_{0.12}Ga_{0.88}As$, each having a film thickness of ¼ of the wavelength in the medium, are alternately stacked; the current confining layer 108 made of p-type $Al_{0.98}Ga_{0.02}As$; the lower spacer layer 110 made of p-type $Al_{0.6}Ga_{0.4}As$; the undoped quantum well active layer (made of three GaAs quantum well layers each having a thickness of 70 nm and four $Al_{0.3}Ga_{0.7}As$ barrier layers each having a thickness of 50 nm) 112; the upper spacer layer 114 made of n-type $Al_{0.6}Ga_{0.4}As$; the n-type intermediate DBR 116 in which plural periods of $Al_{0.9}Ga_{0.1}As$ and $Al_{0.15}Ga_{0.85}As$, each having a film thickness of ¼ of the wavelength in the medium, are alternately stacked; the n-type GaAs layer (optical mode controlling layer) 120 having a carrier concentration of $1 \times 10^{19}$ cm$^{-3}$ and thickness of 200 nm.

Figure 8B:
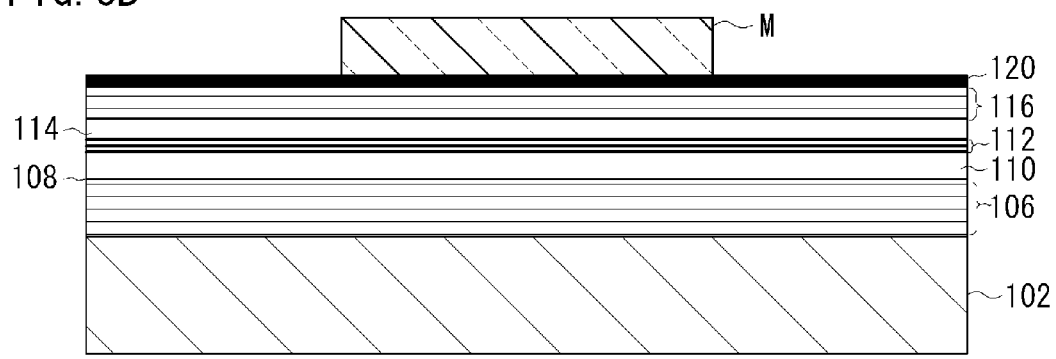
Figure 8C:
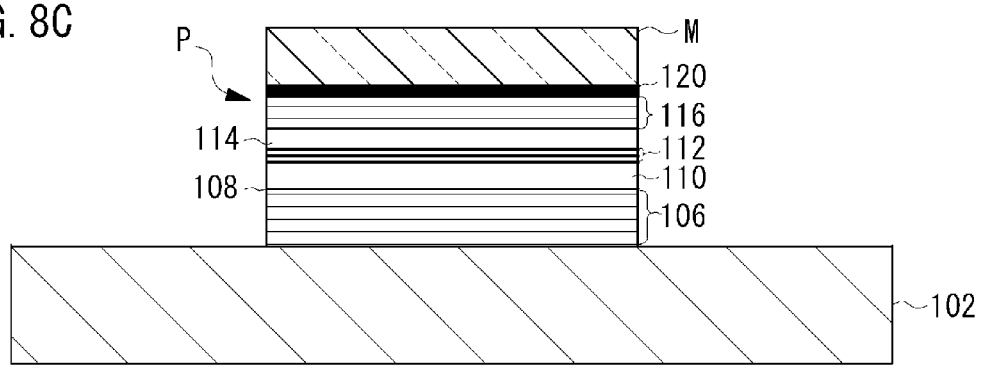

After stopping the epitaxial growth, the substrate is taken out from the chamber, and then as shown in FIG. 8B, a round-shape photoresist pattern M is formed on the optical mode controlling layer 120. Then, as shown in FIG. 8C, by using the photoresist pattern, the semiconductor layers are dry etched to form a cylindrical post structure P on the substrate 102. The post structure P exposes at least the current confining layer 108.

Figure 9A:
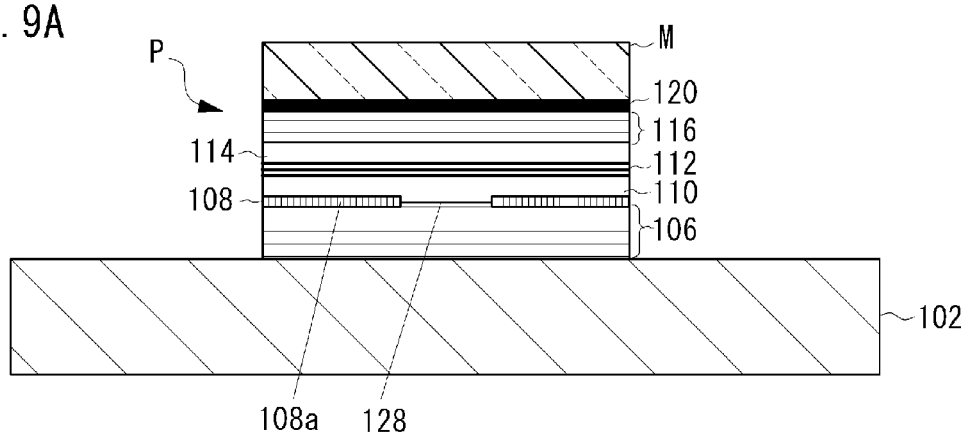
FIGS. 9A to 9C are cross sectional views illustrating a process of a method for fabricating a VCSEL according to a first example of the present invention.

Then, as shown in FIG. 9A, oxidation of the substrate is performed in an oxidation furnace for a predetermined time. By this oxidation, a specified distance from the side surface of the post P is oxidized, and an oxidized area 108a is formed in the current confining layer 108. The area surrounded by the oxidized area 108a becomes the conductive portion 128 that performs current confining during operation.

Figure 9B:
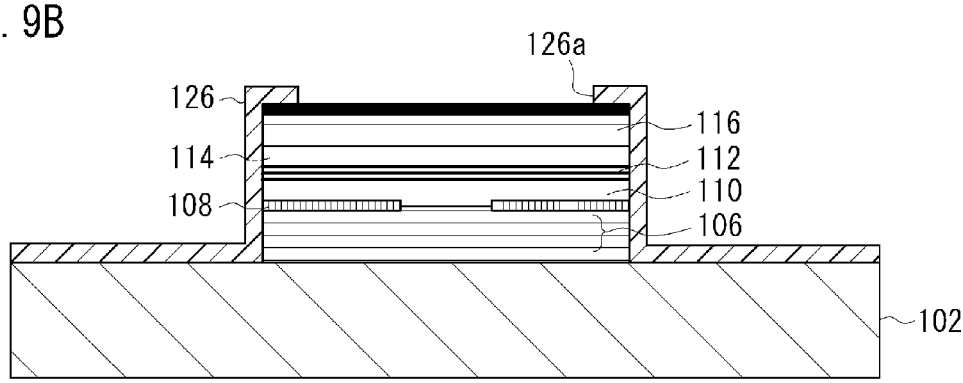

Then, the photoresist pattern M is removed, and the insulating layer 126 of SiN or the like is formed on the entire surface of the substrate. After that, as shown in FIG. 9B, the insulating layer 126 is etched by a photolithography process to form a round-shape opening 126a at a top portion of the post structure P, and the GaAs layer 120 is exposed.

Figure 9C:
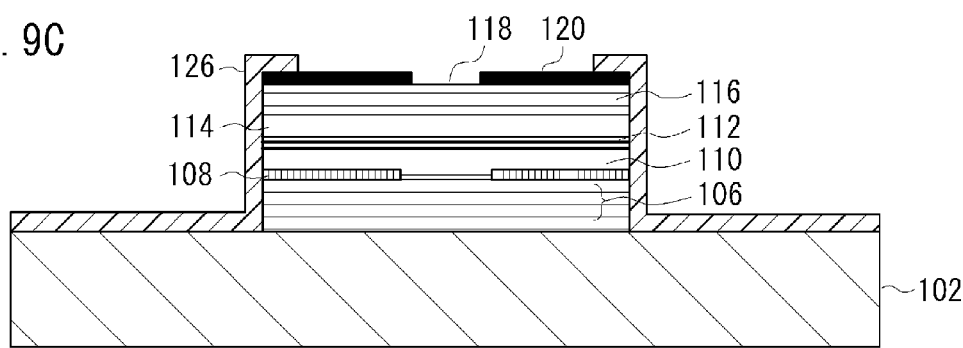

Then, a top portion of the GaAs layer 120 appearing at a top portion of the post structure P is etched by a photolithography process, and as shown in FIG. 9C, a round-shaped opening 118 is formed to obtain the optical mode controlling layer 120.

Then, on the optical mode controlling layer 120, the n-side electrode 122 is formed by lift-off. For a material for the electrode, Au or Cu may be used. Then, on the optical mode controlling layer 120, the upper DBR 124 of dielectric multilayer films made of $SiO_2$ and $TiO_2$, which are dielectric and alternately stacked, is formed. The dielectric multilayer films are formed by vapor deposition or electron beam deposition. In the deposition, $SiO_2$ and $TiO_2$ are alternately deposited such that each of them has a predetermined thickness, by performing thickness management using an optical monitor. Finally, on a back surface of the substrate 102, the p-side electrode 104 is formed. As such, a VCSEL that emits laser light having an oscillation wavelength of about 850 nm can be obtained.

For a material of the layer that performs mode control, other than GaAs, a material that is lattice matched, such as InGaAs, can be used instead. For a VCSEL according to the second example, the thickness of the GaAs layer being the final layer is made to 20 nm, and after that, an optical mode controlling layer that absorbs or reflects off light having an oscillation wavelength is formed on the GaAs layer by a photolithography process.

In the examples described above, a single post structure P is formed on the substrate; however, the VCSEL may be of a multi-beam or multi-spot type in which plural post structures P are formed on the substrate, and laser light is emitted from the plural post structures P. In addition, in the examples described above, a VCSEL in which an AlGaAs system is used; however, the present invention can also be applicable to a VCSEL in which other III-V group compound semiconductor is used. In addition, the shape of the post structure may be rectangular, other than cylindrical shape.

Figure 10A:
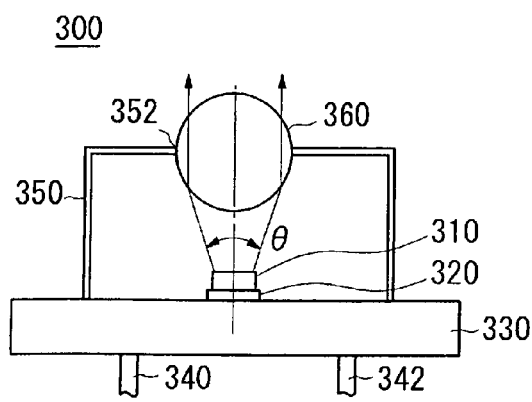
FIGS. 10A and 10B are schematic cross sectional views each illustrating a configuration of a module in which an optical component is implemented in a VCSEL of according to an example.

Referring to drawings, a module, a light sending apparatus, a spatial transmission system, an optical transmission apparatus or the like, which use a VCSEL of an example, will be described. FIG. 10A is a cross sectional view illustrating a configuration of a package (module) in which a VCSEL is mounted. In a package 300, a chip 310 in which a VCSEL is formed is fixed on a disk-shaped metal stem 330 through a conductive adhesive 320. Conductive leads 340, 342 are inserted into through holes (not shown) in the stem 330. One lead 340 is electrically coupled to an n-side electrode of the VCSEL, and the other lead 342 is electrically coupled to a p-side electrode.

On the stem 330, a rectangular hollow cap 350 is fixed to contain the chip 310, and a ball lens 360 is fixed in a center opening of the cap 350. The optical axis of the ball lens 360 is positioned to match an approximate center of the chip 310. When a forward voltage is applied between the leads 340 and 342, laser light is emitted vertically from the chip 310. The distance between the chip 310 and the ball lens 360 may be adjusted so that the ball lens 360 is contained within the divergence angle θ of the laser light from the chip 310. In addition, in the cap, a light sensing element or a thermal sensor may be contained to monitor the emitting status of the VCSEL.

Figure 10B:
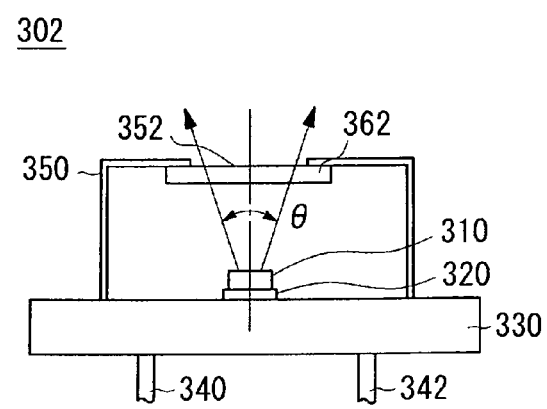

FIG. 10B illustrates a configuration of another package. In a package 302 shown in FIG. 10B, instead of using the ball lens 360, a flat-plate glass 362 is fixed in a center portion of the cap 350. The center of the flat-plate glass 362 is positioned to match an approximate center of the chip 310. The distance between the chip 310 and the flat-plate glass 362 may be adjusted so that the opening diameter of the flat-plate glass 362 is equal to or greater than the divergence angle θ of the laser light from the chip 310.

Figure 11:
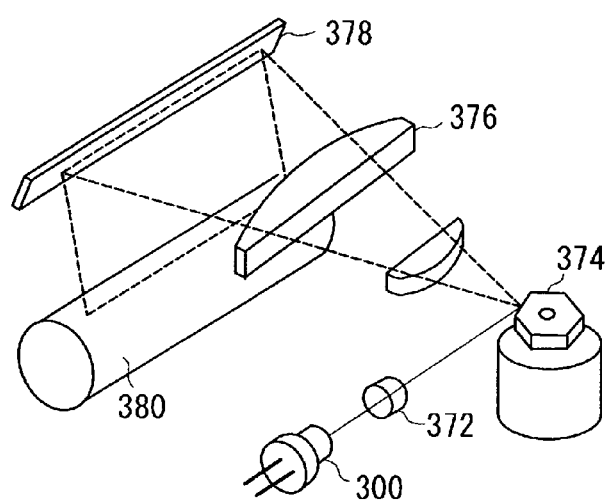
FIG. 11 illustrates an example of a configuration of a light source apparatus in which a VCSEL is used.

FIG. 11 illustrates an example in which a VCSEL is used as a light source. A light source apparatus 370 includes the package 300 in which a VCSEL is implemented as in FIG. 10A or FIG. 10B, a collimator lens 372 that receives multi-beam laser light emitted from the package 300, a polygon mirror 374 that rotates at a certain speed and reflects off light rays from the collimator lens 372 with a certain divergence angle, and fθ lens 376 that receives laser light from the polygon mirror 374 and projects the light on a reflective mirror 378, a line-shaped reflective mirror 378, and a light sensitive drum 380 that forms a latent image based on the reflected light from the reflective mirror 378. As such, a VCSEL can be used as a light source for an optical data processing apparatus, such as a copy machine or printer, equipped with an optical system that collects laser light from the VCSEL onto a light sensitive drum, and a mechanism that scans the collected laser light on the light sensitive drum.

Figure 12:
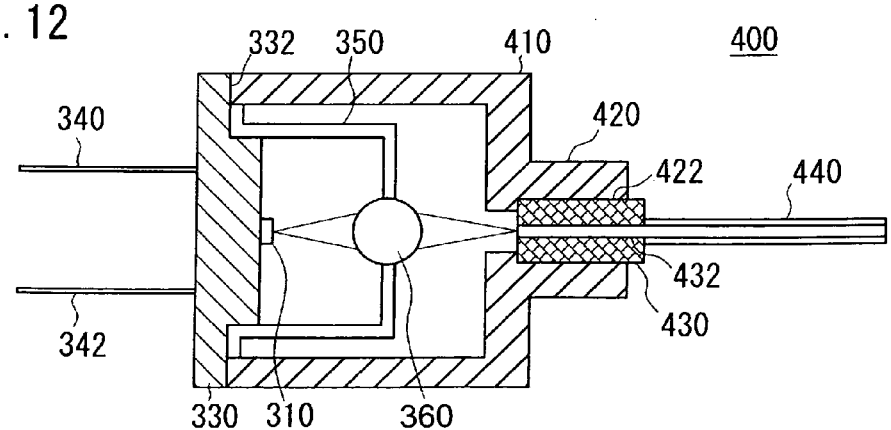
FIG. 12 is a schematic cross sectional view illustrating a configuration of a light sending apparatus in which the module shown in FIG. 10A is used.

FIG. 12 is a cross sectional view illustrating a configuration in which the module shown in FIG. 10A is applied to a light sending device. A light sending device 400 includes a cylindrical housing 410 fixed to the stem 330, a sleeve 420 formed integrally with the housing 410 on an edge surface thereof, a ferrule 430 held in an opening 422 of the sleeve 420, and an optical fiber 440 held by the ferrule 430. In a flange 332 formed in a direction of the circumference of the stem 330, an edge portion of the housing 410 is fixed. The ferrule 430 is positioned exactly in the opening 422 of the sleeve 420. The optical axis of the optical fiber 440 is aligned with the optical axis of the ball lens 360. In a through hole 432 of the ferrule 430, the core of the optical fiber 440 is held.

Laser light emitted from the surface of the chip 310 is concentrated by the ball lens 360. The concentrated light is injected into the core of the optical fiber 440, and transmitted. While the ball lens 360 is used in the above example, other lens such as a biconvex lens or a plano-convex lens may be used. In addition, the light sending device 400 may include a driving circuit for applying an electrical signal to the leads 340, 342. Furthermore, the light sending device 400 may have a receiving function for receiving an optical signal via the optical fiber 440.

Figure 13:
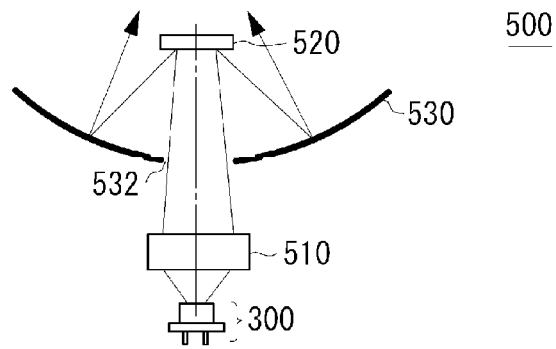
FIG. 13 illustrates a configuration in which the module shown in FIG. 10A is used for an optical transmission system.

FIG. 13 illustrates a configuration in which the module shown in FIG. 12 is used in a spatial transmission system. A spatial transmission system 500 includes a package 300, a condensing lens 510, a diffusing plate 520, and a reflective mirror 530. The light concentrated by the condensing lens 510 is reflected off the diffusing plate 520 through an opening 532 of the reflective mirror 530. The reflected light is reflected toward the reflective mirror 530. The reflective mirror 530 reflects off the reflected light toward a predetermined direction to perform optical transmission.

Figure 14A:
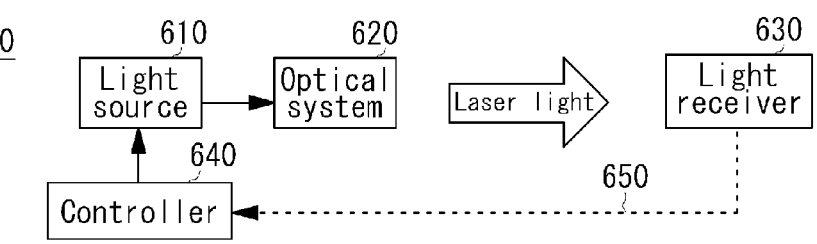
FIG. 14A illustrates a block diagram of a configuration of an optical transmission system.

FIG. 14A illustrates an exemplary configuration of an optical transmission system in which a VCSEL is used as a light source. An optical transmission system 600 includes a light source 610 that contains the chip 310 in which a VCSEL is formed, an optical system 620, for example, for concentrating laser light emitted from the light source 610, a light receiver 630 for receiving laser light outputted from the optical system 620, and a controller 640 for controlling the driving of the light source 610. The controller 640 provides a driving pulse signal for driving the VCSEL to the light source 610. The light emitted from the light source 610 is transmitted through the optical system 620 to the light receiver 630 by an optical fiber or a reflective mirror for spatial transmission. The light receiver 630 may detect the received light by a photo-detector, for example. The light receiver 630 is capable of controlling operations (for example, the start timing of optical transmission) of the controller 640, by a control signal 650.

Figure 14B:
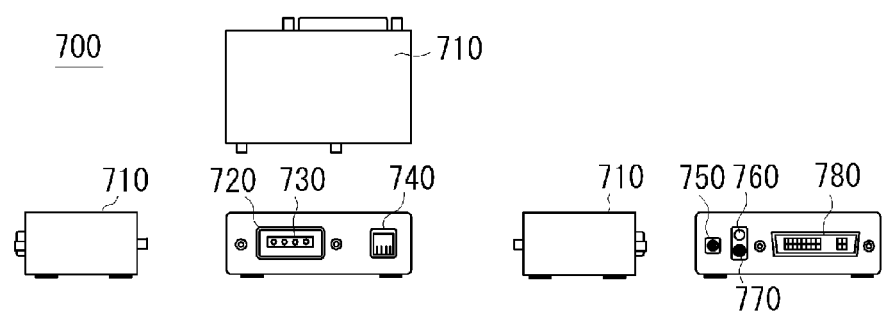
FIG. 14B illustrates an outer configuration of an optical transmission apparatus.

FIG. 14B illustrates a general configuration of an optical transmission apparatus used for an optical transmission system. An optical transmission apparatus 700 includes a case 710, and optical signal transmitting/receiving connector 720, a light emitting/light receiving element 730, an electrical signal cable connector 740, a power input 750, an LED 760 for indicating normal operation, an LED 770 for indicating an abnormality, and a DVI connector 780. Inside the apparatus, a transmitting circuit board/receiving circuit board is contained.

Figure 15:
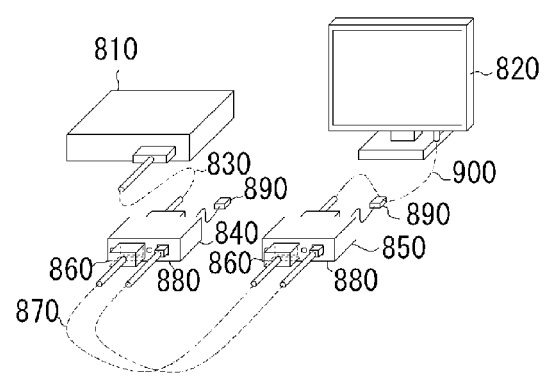
FIG. 15 illustrates a video transmission system in which the optical transmission apparatus of FIG. 14B is used.

A video transmission system is shown in FIG. 15 in which the optical transmission apparatus 700 is used. A video transmission system 800 uses the optical transmission apparatus shown in FIG. 14B for transmitting a video signal generated at a video signal generator 810 to an image display 820 such as a liquid crystal display. More specifically, the video transmission system 800 includes the video signal generator 810, the image display 820, an electrical cable 830 for DVI, a transmitting module 840, a receiving module 850, a connector 860 for a video signal transmission optical signal, an optical fiber 870, an electrical cable connector 880 for a control signal, a power adapter 890, and an electrical cable 900 for DVI.

A surface emitting semiconductor laser according to the present invention can be used in fields such as an optical data processing, or optical high speed data communication.

The foregoing description of the examples has been provided for the purposes of illustration and description, and it is not intended to limit the scope of the invention. It should be understood that the invention may be implemented by other methods within the scope of the invention that satisfies requirements of a configuration of the present invention.

What is claimed is:

1. A surface emitting semiconductor laser, comprising:
a substrate;
a lower reflective mirror formed on the substrate;
an active layer formed on the lower reflective mirror, and emitting light;
an upper reflective mirror formed on the active layer, and forming a resonator between the lower reflective mirror and thereof;
an optical mode controlling layer comprising a single layer and being formed between the lower reflective mirror and the upper reflective mirror, and an opening being formed therein for selectively absorbing or reflecting off light that is emitted in the active layer, the opening being formed to have slit-like shapes, and the optical mode controlling layer optically controlling mode of laser light; and
a current confining layer formed between the lower reflective mirror and the upper reflective mirror, and confining current that is applied during driving,
wherein a portion of light emitted from the active layer passes through the opening, and the rest of the light is absorbed by or reflected off the optical mode controlling layer, and
the optical mode controlling layer is made of a semiconductor layer that has a lattice constant matched to the active layer.

2. The surface emitting semiconductor laser according to claim 1, wherein the current confining layer comprises a conductive portion and a highly reflective portion that has a higher resistance than the conductive portion does, and the conductive portion is surrounded by the highly reflective portion, and the center of the opening of the optical mode controlling layer coincides with the center of the conductive portion.

3. The surface emitting semiconductor laser according to claim 2, wherein a diameter of the opening of the optical mode controlling layer is smaller than that of the conductive portion of the current confining layer.

4. The surface emitting semiconductor laser according to claim 2, wherein the highly reflective portion of the current confining layer is a selectively oxidized area.

5. The surface emitting semiconductor laser according to claim 1, wherein the lower reflective mirror has a first conductivity type, and the optical mode controlling layer has a second conductivity type, and an electrode is formed between the optical mode controlling layer and the upper reflective mirror, and the electrode is electrically coupled to the optical mode controlling layer.

6. The surface emitting semiconductor laser according to claim 1, wherein the opening of the optical mode controlling layer is formed into plural openings that are symmetrical with regard to the center of the opening.

7. The surface emitting semiconductor laser according to claim 1, wherein the opening of the optical mode controlling layer is formed into plural openings that are point-symmetric with regard to the center of the opening.

8. The surface emitting semiconductor laser according to claim 1, wherein the diameter of the opening of the optical mode controlling layer is selected in accordance with a wavelength of laser light to be emitted.

9. A module comprising:
a surface emitting semiconductor laser;
an electrical connecting terminal electrically coupled to the surface emitting semiconductor laser; and
an optical component that injects light emitted from the surface emitting semiconductor laser,
the surface emitting semiconductor laser comprising a substrate, a lower reflective mirror formed on the substrate, an active layer formed on the lower reflective mirror and emitting light, an upper reflective mirror formed on the active layer and forming a resonator between the lower reflective mirror and thereof, an optical mode controlling layer comprising a single layer and being formed between the lower reflective mirror and the upper reflective mirror and an opening being formed therein for selectively absorbing or reflecting off light that is emitted in the active layer, the opening being formed to have slit-like shapes, and the optical mode controlling layer optically controlling mode of laser light, and a current confining layer formed between the lower reflective mirror and the upper reflective mirror and confining current that is applied during driving, wherein a portion of light emitted from the active layer passes through the opening, and the rest of the light is absorbed by or reflected off the optical mode controlling layer, and the optical mode controlling layer is made of a semiconductor layer that has a lattice constant matched to the active layer.

10. A light source apparatus, comprising:
a surface emitting semiconductor laser; and
an irradiating unit that irradiates light emitted from the surface emitting semiconductor laser through an optical component that comprises at least one of a lens or a mirror,
the surface emitting semiconductor laser comprising a substrate, a lower reflective mirror formed on the substrate, an active layer formed on the lower reflective mirror and emitting light, an upper reflective mirror formed on the active layer and forming a resonator between the lower reflective mirror and thereof, an optical mode controlling layer comprising a single layer and being formed between the lower reflective mirror and the upper reflective mirror and an opening being formed therein for selectively absorbing or reflecting off light that is emitted in the active layer, the opening being formed to have slit-like shapes, and the optical mode controlling layer optically controlling mode of laser light, and a current confining layer formed between the lower reflective mirror and the upper reflective mirror and confining current that is applied during driving, wherein a portion of light emitted from the active layer passes through the opening, and the rest of the light is absorbed by or reflected off the optical mode controlling layer, and the optical mode controlling layer is made of a semiconductor layer that has a lattice constant matched to the active layer.

11. A data processing apparatus, comprising:

a module; and a sending unit that sends light emitted from a surface emitting semiconductor laser, the module comprising the surface emitting semiconductor laser, an electrical connecting terminal electrically coupled to the surface emitting semiconductor laser, and an optical component that injects light emitted from the surface emitting semiconductor laser, the surface emitting semiconductor laser comprising a substrate, a lower reflective mirror formed on the substrate, an active layer formed on the lower reflective mirror and emitting light, an upper reflective mirror formed on the active layer and forming a resonator between the lower reflective mirror and thereof, an optical mode controlling layer comprising a single layer and being formed between the lower reflective mirror and the upper reflective mirror and an opening being formed therein for selectively absorbing or reflecting off light that is emitted in the active layer, the opening being formed to have slit-like shapes, and the optical mode controlling layer optically controlling mode of laser light, and a current confining layer formed between the lower reflective mirror and the upper reflective mirror and confining current that is applied during driving, wherein a portion of light emitted from the active layer passes through the opening, and the rest of the light is absorbed by or reflected off the optical mode controlling layer, and the optical mode controlling layer is made of a semiconductor layer that has a lattice constant matched to the active layer.

12. An optical spatial transmission system, comprising:

a module; and a transmission unit that spatially transmits light emitted from a surface emitting semiconductor laser, the module comprising the surface emitting semiconductor laser, an electrical connecting terminal electrically coupled to the surface emitting semiconductor laser, and an optical component that injects light emitted from the surface emitting semiconductor laser, the surface emitting semiconductor laser comprising a substrate, a lower reflective mirror formed on the substrate, an active layer formed on the lower reflective mirror and emitting light, an upper reflective mirror formed on the active layer and forming a resonator between the lower reflective mirror and thereof, an optical mode controlling layer comprising a single layer and being formed between the lower reflective mirror and the upper reflective mirror and an opening being formed therein for selectively absorbing or reflecting off light that is emitted in the active layer, the opening being formed to have slit-like shapes, and the optical mode controlling layer optically controlling mode of laser light, and a current confining layer formed between the lower reflective mirror and the upper reflective mirror and confining current that is applied during driving, wherein a portion of light emitted from the active layer passes through the opening, and the rest of the light is absorbed by or reflected off the optical mode controlling layer, and the optical mode controlling layer is made of a semiconductor layer that has a lattice constant matched to the active layer.

* * * * *